United States Patent
Li et al.

(10) Patent No.: US 11,612,037 B2
(45) Date of Patent: Mar. 21, 2023

(54) LIGHTING APPARATUS

(71) Applicant: LEEDARSON LIGHTING CO., LTD., Fujian (CN)

(72) Inventors: Deyun Li, Fujian (CN); Zhixian Wu, Fujian (CN); Renhua Zou, Fujian (CN); Xianyi Lin, Fujian (CN); Shuifa Guo, Fujian (CN)

(73) Assignee: LEEDARSON LIGHTING CO., LTD., Fujian (CN)

( * ) Notice: Subject to any disclaimer, the term of this patent is extended or adjusted under 35 U.S.C. 154(b) by 0 days.

(21) Appl. No.: 17/680,031

(22) Filed: Feb. 24, 2022

(65) Prior Publication Data

US 2022/0272814 A1 Aug. 25, 2022

(30) Foreign Application Priority Data

Feb. 24, 2021 (CN) .......................... 202120412453.0

(51) Int. Cl.
*H05B 45/50* (2022.01)
*F21K 9/00* (2016.01)
*H02H 7/20* (2006.01)
*F21V 25/10* (2006.01)

(52) U.S. Cl.
CPC ............... *H05B 45/50* (2020.01); *F21K 9/00* (2013.01); *F21V 25/10* (2013.01); *H02H 7/20* (2013.01); *H05K 2201/10106* (2013.01)

(58) Field of Classification Search
CPC .......... H05K 2201/10098; H05K 2201/10113; H05B 2201/10106; F21K 9/00
See application file for complete search history.

(56) References Cited

U.S. PATENT DOCUMENTS

| | | | | |
|---|---|---|---|---|
| 2015/0327349 A1* | 11/2015 | Lee | ......................... | F21K 9/232 362/373 |
| 2020/0284400 A1* | 9/2020 | Wu | ......................... | F21V 29/71 |
| 2020/0318823 A1* | 10/2020 | Bocock | ................... | F21V 29/83 |

* cited by examiner

*Primary Examiner* — Anh Q Tran
(74) *Attorney, Agent, or Firm* — Chun-Ming Shih; Lanway IPR Services (57) ABSTRACT

A lighting apparatus includes a wireless circuit board, a driver circuit board, a light source plate, a metal cover and a metal housing. The wireless circuit board is mounted with a wireless circuit. The wireless circuit has a first reference ground terminal. The driver circuit board is mounted with a driver circuit. The driver circuit has a second reference ground terminal. The light source plate is mounted with a LED module. The light source plate is placed on a top side of the metal cover. The first reference ground terminal and the second reference ground terminal are connected to the metal cover as a reference ground. The metal housing and a bottom side of the metal cover forms a container space for holding the driver circuit board and a first portion of the wireless circuit board.

20 Claims, 7 Drawing Sheets

LIGHTING APPARATUS

FIELD

The present invention is related to a lighting apparatus, and more particularly related to a lighting apparatus with a smart circuit.

BACKGROUND

The time when the darkness is being lighten up by the light, human have noticed the need of lighting up this planet. Light has become one of the necessities we live with through the day and the night. During the darkness after sunset, there is no natural light, and human have been finding ways to light up the darkness with artificial light. From a torch, candles to the light we have nowadays, the use of light have been changed through decades and the development of lighting continues on.

Early human found the control of fire which is a turning point of the human history. Fire provides light to bright up the darkness that have allowed human activities to continue into the darker and colder hour of the hour after sunset. Fire gives human beings the first form of light and heat to cook food, make tools, have heat to live through cold winter and lighting to see in the dark.

Lighting is now not to be limited just for providing the light we need, but it is also for setting up the mood and atmosphere being created for an area. Proper lighting for an area needs a good combination of daylight conditions and artificial lights. There are many ways to improve lighting in a better cost and energy saving. LED lighting, a solid-state lamp that uses light-emitting diodes as the source of light, is a solution when it comes to energy-efficient lighting. LED lighting provides lower cost, energy saving and longer life span.

The major use of the light emitting diodes is for illumination. The light emitting diodes is recently used in light bulb, light strip or light tube for a longer lifetime and a lower energy consumption of the light. The light emitting diodes shows a new type of illumination which brings more convenience to our lives. Nowadays, light emitting diode light may be often seen in the market with various forms and affordable prices.

After the invention of LEDs, the neon indicator and incandescent lamps are gradually replaced. However, the cost of initial commercial LEDs was extremely high, making them rare to be applied for practical use. Also, LEDs only illuminated red light at early stage. The brightness of the light only could be used as indicator for it was too dark to illuminate an area. Unlike modern LEDs which are bound in transparent plastic cases, LEDs in early stage were packed in metal cases.

In 1878, Thomas Edison tried to make a usable light bulb after experimenting different materials. In November 1879, Edison filed a patent for an electric lamp with a carbon filament and keep testing to find the perfect filament for his light bulb. The highest melting point of any chemical element, tungsten, was known by Edison to be an excellent material for light bulb filaments, but the machinery needed to produce super-fine tungsten wire was not available in the late 19th century. Tungsten is still the primary material used in incandescent bulb filaments today.

Early candles were made in China in about 200 BC from whale fat and rice paper wick. They were made from other materials through time, like tallow, spermaceti, colza oil and beeswax until the discovery of paraffin wax which made production of candles cheap and affordable to everyone. Wick was also improved over time that made from paper, cotton, hemp and flax with different times and ways of burning. Although not a major light source now, candles are still here as decorative items and a light source in emergency situations. They are used for celebrations such as birthdays, religious rituals, for making atmosphere and as a decor.

Illumination has been improved throughout the times. Even now, the lighting device we used today are still being improved. From the illumination of the sun to the time when human can control fire for providing illumination which changed human history, we have been improving the lighting source for a better efficiency and sense. From the invention of candle, gas lamp, electric carbon arc lamp, kerosene lamp, light bulb, fluorescent lamp to LED lamp, the improvement of illumination shows the necessity of light in human lives.

There are various types of lighting apparatuses. When cost and light efficiency of LED have shown great effect compared with traditional lighting devices, people look for even better light output. It is important to recognize factors that can bring more satisfaction and light quality and flexibility.

It is important to handle ground connecting in circuit design. Light devices also have such issues. Therefore, it is important to provide a novel structure for connecting ground to various parts of a circuit.

In addition, static electricity causes damages of electronic components. It is important to solve such issue at the same time. It is important to handle ground connecting in circuit design. Light devices also have such issues. Therefore, it is important to provide a novel structure for connecting ground to various parts of a circuit.

In addition, static electricity causes damages of electronic components. It is important to solve such issue at the same time. It is important to handle ground connecting in circuit design. Light devices also have such issues. Therefore, it is important to provide a novel structure for connecting ground to various parts of a circuit.

In addition, static electricity causes damages of electronic components. It is important to solve such issue at the same time. It is important to handle ground connecting in circuit design. Light devices also have such issues. Therefore, it is important to provide a novel structure for connecting ground to various parts of a circuit.

In addition, static electricity causes damages of electronic components. It is important to solve such issue at the same time.

SUMMARY

In some embodiments, a lighting apparatus includes a wireless circuit board, a driver circuit board, a light source plate, a metal cover and a metal housing.

The wireless circuit board is mounted with a wireless circuit.

The wireless circuit has a first reference ground terminal.

The driver circuit board is mounted with a driver circuit.

The driver circuit has a second reference ground terminal.

The light source plate is mounted with a LED module.

The light source plate is placed on a top side of the metal cover.

The first reference ground terminal and the second reference ground terminal are connected to the metal cover as a reference ground.

The metal housing and a bottom side of the metal cover forms a container space for holding the driver circuit board and a first portion of the wireless circuit board.

A second portion of the wireless circuit board extends through an antenna hole of the light source plate to be above the top side of the light source plate.

In some embodiments, a voltage dependent resistor is disposed between the first reference ground terminal to the metal cover.

In some embodiments, the first reference ground terminal has a contact pad for collecting a wireless reference ground end.

The contact pad is connected to the reference ground of the metal cover via a connector.

In some embodiments, the connector has an elastic pin for elastically engaging the metal cover.

In some embodiments, the voltage dependent resistor is placed between the contact pad and wireless circuit.

In some embodiments, an insulation area is placed between the contact pad and other area of the wireless circuit board.

In some embodiments, a first diameter of the insulation area is smaller than a half of the contact pad.

In some embodiments, the insulation area is a ring shape.

In some embodiments, the insulation area has a sawtooth border.

In some embodiments, the metal housing is coupled to an Edison cap for connecting to an Edison socket.

In some embodiments, the lighting apparatus may also include a bulb shell enclosing the second portion of the wireless circuit board.

In some embodiments, the wireless circuit board has a third reference ground terminal.

The wireless circuit has a first wireless module connecting to the first reference ground terminal and a second wireless module connecting to the third reference ground terminal.

The first wireless module and the second wireless module correspond to different wireless protocols.

In some embodiments, the wireless circuit board has a signal terminal connecting to the driver circuit board.

In some embodiments, the light source plate has a metal substrate facing to the metal cover.

In some embodiments, the metal cover and the metal housing are coupled via a rivet joint.

In some embodiments, the second portion of the wireless circuit board is covered with a reflective layer.

In some embodiments, the second portion of the wireless circuit board is transparent.

In some embodiments, an antenna is attached on the second portion of the wireless circuit board.

In some embodiments, a fluorescent layer is attached on the second portion of the wireless circuit board.

In some embodiments, a static electricity of the driver circuit is guided to the metal cover.

DETAILED DESCRIPTION

Figure 6:
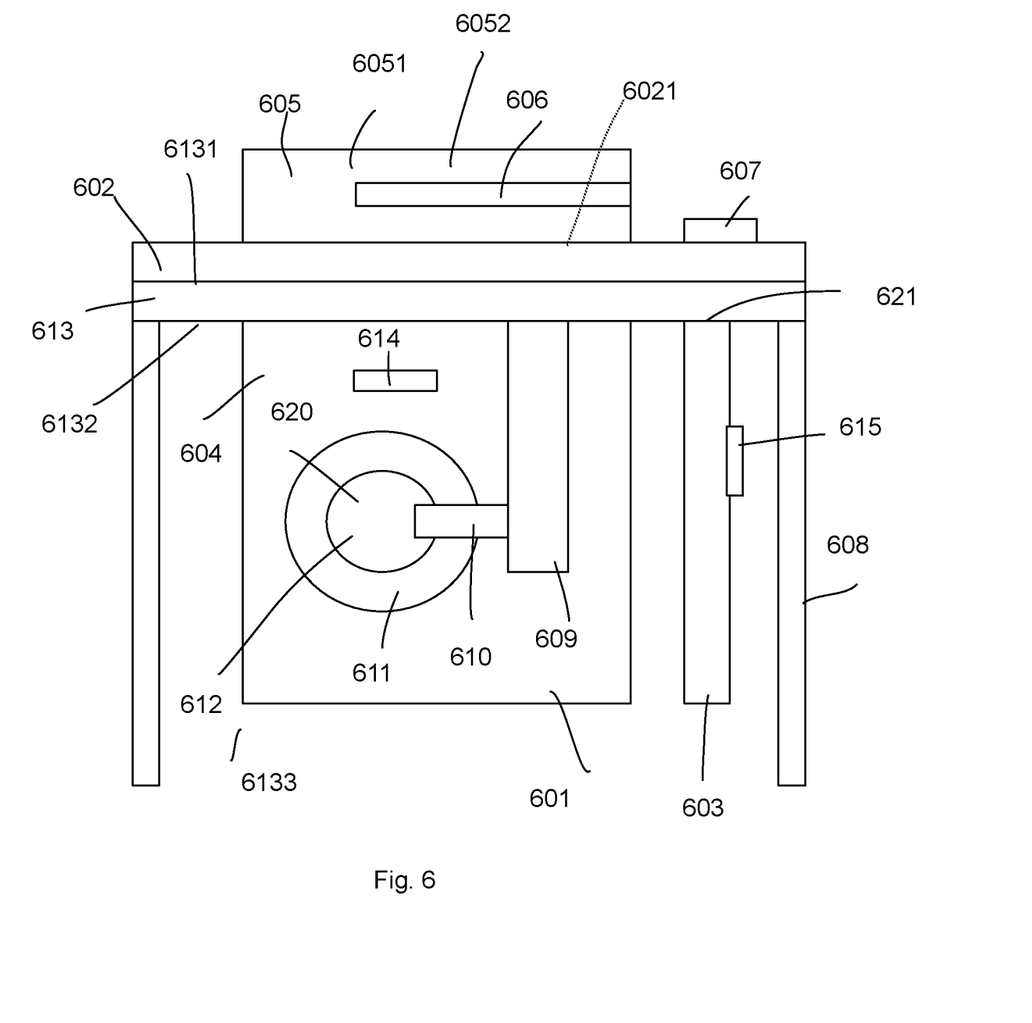
FIG. 6 shows a lighting apparatus embodiment.

In FIG. 6, a lighting apparatus includes a wireless circuit board 601, a driver circuit board 603, a light source plate 602, a metal cover 613 and a metal housing 608.

The wireless circuit board 601 is mounted with a wireless circuit 614. For example, a Wi-Fi module is placed on the wireless circuit board 601 for providing a Wi-Fi connection with other devices. Other wireless protocols may be implemented depending on different needs.

The wireless circuit 614 has a first reference ground terminal 620.

The driver circuit board 603 is mounted with a driver circuit 615. The driver circuit 615 converts an external power source, e.g. a 110V AC power to one or multiple driving currents supplied to the LED 607 on the light source plate 602. The driver circuit 615 may also decode an operation on a wall switch connecting to the lighting apparatus to turn-on, turn-off, or change a light parameter of the lighting apparatus.

In addition, the driver circuit 615 may receive a command from the wireless circuit 614 and controls the LED module 607 corresponding to the command. For example, the command may instruct a color temperature, a color, a light intensity or other light parameters.

The driver circuit 615 has a second reference ground terminal 621.

The light source plate 602 is mounted with a LED module 607.

The light source plate 602 is placed on a top side 6131 of the metal cover 613.

The first reference ground terminal 620 and the second reference ground terminal 621 are connected to the metal cover 613 as a reference ground. The metal cover 613 is further connected to the metal housing 608, e.g. a metal tube, to form a larger ground unit.

The metal housing 608 and a bottom side 6132 of the metal cover 613 forms a container space 6133 for holding the driver circuit board 603 and a first portion 604 of the wireless circuit board 601.

A second portion 605 of the wireless circuit board 601 extends through an antenna hole 6021 of the light source plate 602 to be above the top side 6131 of the light source plate 602.

In some embodiments, a voltage dependent resistor 610 is disposed between the first reference ground terminal 620 to the metal cover 613.

In some embodiments, the first reference ground terminal 620 has a contact pad 612 for collecting a wireless reference ground end, e.g. the nodes associated to the ground of the wireless circuit.

The contact pad 612 is connected to the reference ground of the metal cover 613 via a connector 609.

In some embodiments, the connector 609 has an elastic pin for elastically engaging the metal cover.

Figure 5:
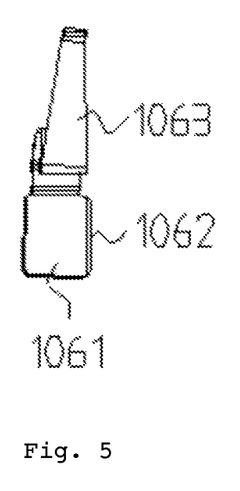
FIG. 5 illustrates a connector example.

FIG. 5 shows such an example. The connector 1061 has a head part 1062 connected to the contact pad and an elastic pin as a tail part 1063 pressing the metal cover as mentioned above.

In some embodiments, the voltage dependent resistor 610 is placed between the contact pad 612 and wireless circuit 614.

In some embodiments, an insulation area 611 is placed between the contact pad 610 and other area of the wireless circuit board 601.

Figure 8:
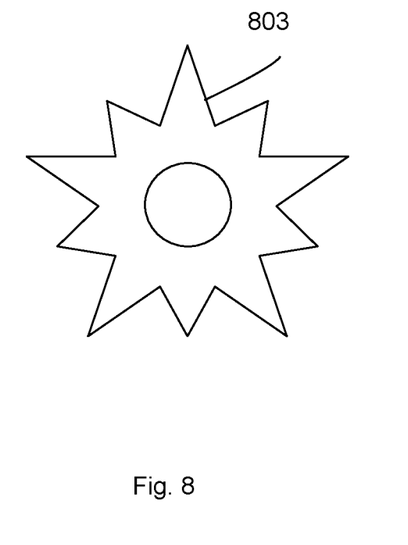
FIG. 8 shows another contact pad example.

In FIG. 8, a first diameter 801 of the insulation area, i.e. the width of the insulation belt, is smaller than a half of the contact pad, i.e. the diameter 801 of the contact pad.

Figure 7:
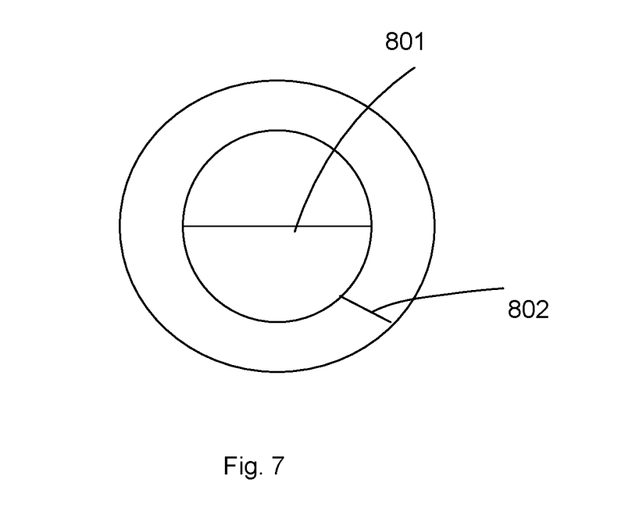
FIG. 7 shows a contact pad example.

In some embodiments, the insulation area is a ring shape, as illustrated in FIG. 7.

In FIG. 8, the insulation area has a sawtooth border 803, as illustrated in FIG. 8. The sawtooth 803 enhances condensing of static electricity.

Figure 4:
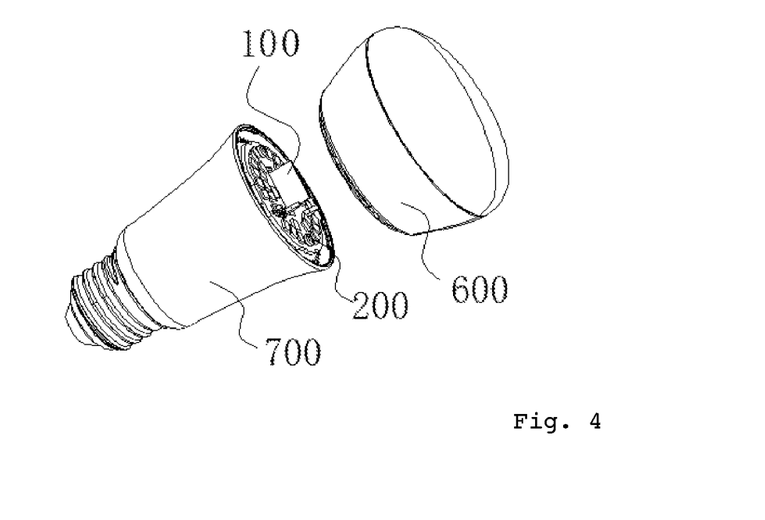
FIG. 4 illustrates a light bulb example.

In some embodiments, the metal housing is coupled to an Edison cap for connecting to an Edison socket, as illustrated in FIG. 4.

In some embodiments, the lighting apparatus may also include a bulb shell 600 enclosing the second portion of the wireless circuit board.

In some embodiments, the wireless circuit board has a third reference ground terminal. This is similar to the illustration of the first reference ground terminal and thus is not explicitly illustrated in the drawing. FIG. 6 is sufficient to illustrate such terminal by reference to the first reference ground terminal.

The wireless circuit has a first wireless module connecting to the first reference ground terminal and a second wireless module connecting to the third reference ground terminal.

The first wireless module and the second wireless module correspond to different wireless protocols.

In some embodiments, the wireless circuit board has a signal terminal connecting to the driver circuit board.

In some embodiments, the light source plate has a metal substrate facing to the metal cover.

In some embodiments, the metal cover and the metal housing are coupled via a rivet joint.

In FIG. 6, the second portion of the wireless circuit board is covered with a reflective layer 6051.

In some embodiments, the second portion of the wireless circuit board is transparent.

In some embodiments, an antenna 606 is attached on the second portion of the wireless circuit board 601.

In some embodiments, a fluorescent layer 6052 is attached on the second portion 605 of the wireless circuit board 601. When light enters the fluorescent layer 6051, a conversion is performed on light characteristic to create a special light pattern.

In some embodiments, a static electricity of the driver circuit is guided to the metal cover 605.

Figure 1:
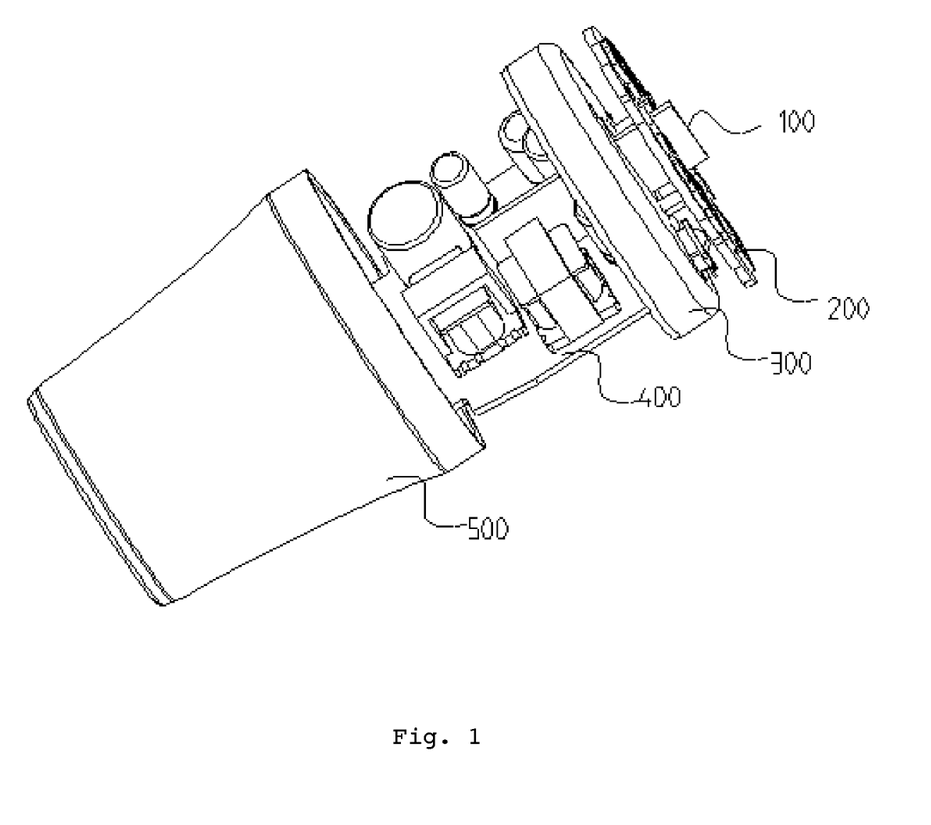
FIG. 1 illustrates a lighting apparatus.

FIG. 1 illustrates a lighting apparatus embodiment.

In FIG. 1, the lighting apparatus includes a wireless circuit board 100, a light source plate 200, a metal cover 300, a driver plate 400 and a metal housing 500.

Figure 2:
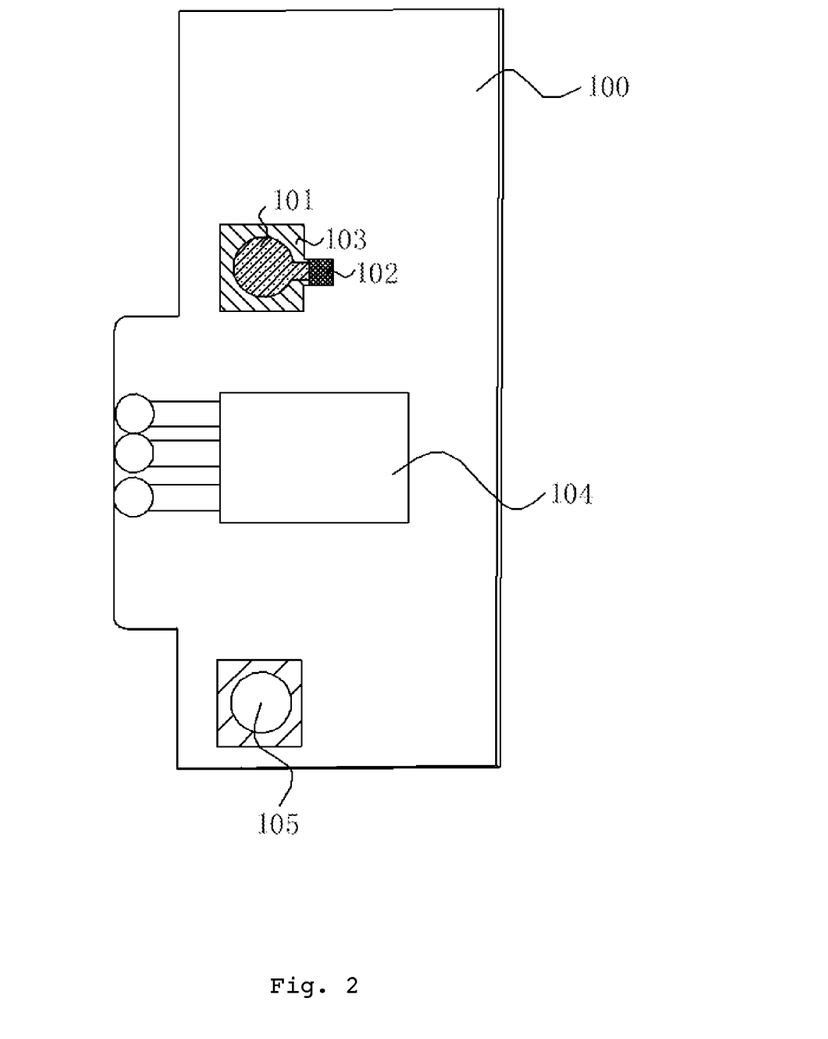
FIG. 2 illustrates a wireless circuit board example.

FIG. 2 shows the wireless circuit plate 100. The wireless circuit plate 100 has a wireless circuit 104, a signal terminal 105 and a reference ground terminal. The reference ground terminal has a contact pad 101, an insulation area 103 and a voltage dependent resistor 102.

Figure 3:
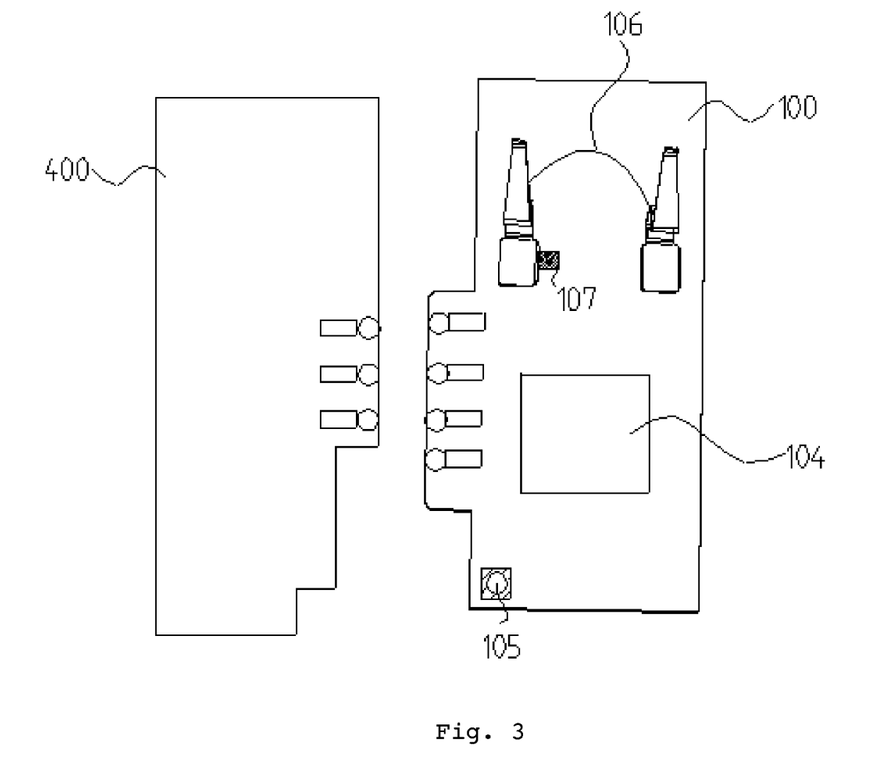
FIG. 3 illustrates a driver circuit board and a wireless circuit board.

FIG. 3 shows the driver plate 400 is connected to the wireless circuit plate 100. There are two connectors 106 for connecting the reference ground terminal 107 to the metal cover.

FIG. 4 shows a bulb shell 600 covering the second portion of the wireless circuit plate 100 that protrudes on a top side of the light source plate 200. The metal housing 700 encloses the driver circuit and first portion of the wireless circuit plate 100.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings.

The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying drawings, it is to be noted that various changes and modifications will become apparent to those skilled in the art. Such changes and modifications are to be understood as being included within the scope of the disclosure and examples as defined by the claims.

The invention claimed is:

1. A lighting apparatus, comprising:
    a wireless circuit board mounted with a wireless circuit, wherein the wireless circuit has a first reference ground terminal;
    a driver circuit board mounted with a driver circuit, wherein the driver circuit has a second reference ground terminal;
    a light source plate mounted with a LED module;
    a metal cover, wherein the light source plate is placed on a top side of the metal cover, wherein the first reference ground terminal and the second reference ground terminal are connected to the metal cover as a reference ground; and
    a metal housing, wherein the metal housing and a bottom side of the metal cover forms a container space for holding the driver circuit board and a first portion of the wireless circuit board, wherein a second portion of the wireless circuit board extends through an antenna hole of the light source plate to be above the top side of the light source plate.

2. The lighting apparatus of claim 1, wherein a voltage dependent resistor is disposed between the first reference ground terminal to the metal cover.

3. The lighting apparatus of claim 2, wherein the first reference ground terminal has a contact pad for collecting a wireless reference ground end, wherein the contact pad is connected to the reference ground of the metal cover via a connector.

4. The lighting apparatus of claim 3, wherein the connector has an elastic pin for elastically engaging the metal cover.

5. The lighting apparatus of claim 3, wherein the voltage dependent resistor is placed between the contact pad and wireless circuit.

6. The lighting apparatus of claim 3, wherein an insulation area is placed between the contact pad and other area of the wireless circuit board.

7. The lighting apparatus of claim 6, wherein a first diameter of the insulation area is smaller than a half of the contact pad.

8. The lighting apparatus of claim 3, wherein the insulation area is a ring shape.

9. The lighting apparatus of claim 3, wherein the insulation area has a sawtooth border.

10. The lighting apparatus of claim 1, wherein the metal housing is coupled to an Edison cap for connecting to an Edison socket.

11. The lighting apparatus of claim 10, further comprising a bulb shell enclosing the second portion of the wireless circuit board.

12. The lighting apparatus of claim 1, wherein the wireless circuit board has a third reference ground terminal, wherein the wireless circuit has a first wireless module connecting to the first reference ground terminal and a second wireless module connecting to the third reference ground terminal, wherein the first wireless module and the second wireless module correspond to different wireless protocols.

13. The lighting apparatus of claim 12, wherein the wireless circuit board has a signal terminal connecting to the driver circuit board.

14. The lighting apparatus of claim 1, wherein the light source plate has a metal substrate facing to the metal cover.

15. The lighting apparatus of claim 1, wherein the metal cover and the metal housing are coupled via a rivet joint.

16. The lighting apparatus of claim 1, wherein the second portion of the wireless circuit board is covered with a reflective layer.

17. The lighting apparatus of claim 1, wherein the second portion of the wireless circuit board is transparent.

18. The lighting apparatus of claim 17, wherein an antenna is attached on the second portion of the wireless circuit board.

19. The lighting apparatus of claim 17, wherein a fluorescent layer is attached on the second portion of the wireless circuit board.

20. The lighting apparatus of claim 1, wherein a static electricity of the driver circuit is guided to the metal cover.

* * * * *